United States Patent
Heo et al.

(10) Patent No.: US 10,456,939 B2
(45) Date of Patent: Oct. 29, 2019

(54) CELL CUTTING DEVICE FOR DISPLAY DEVICES

(71) Applicant: SAMSUNG DISPLAY CO., LTD., Yongin-si, Gyeonggi-do (KR)

(72) Inventors: Kyung-Hoe Heo, Yongin-si (KR); Seung-Jun Lee, Yongin-si (KR)

(73) Assignee: Samsung Display Co., Ltd., Yongin, Gyunggi-do (KR)

( * ) Notice: Subject to any disclaimer, the term of this patent is extended or adjusted under 35 U.S.C. 154(b) by 0 days.

(21) Appl. No.: 15/869,966

(22) Filed: Jan. 12, 2018

(65) Prior Publication Data

US 2018/0133914 A1 May 17, 2018

Related U.S. Application Data

(62) Division of application No. 13/688,382, filed on Nov. 29, 2012, now Pat. No. 9,931,757.

(30) Foreign Application Priority Data

Jul. 23, 2012 (KR) ........................ 10-2012-0080255

(51) Int. Cl.
*B26D 3/00* (2006.01)
*B26D 7/01* (2006.01)
(Continued)

(52) U.S. Cl.
CPC .............. *B26D 3/00* (2013.01); *B26D 1/015* (2013.01); *B26D 1/105* (2013.01); *B26D 3/085* (2013.01);
(Continued)

(58) Field of Classification Search
CPC ....... C03B 33/00; C03B 33/02; C03B 33/027; C03B 33/07; C03B 33/074; C03B 33/076; B26D 1/015; B26D 1/105; B26D 3/00
See application file for complete search history.

(56) References Cited

U.S. PATENT DOCUMENTS 3,453,097 A * 7/1969 Hafner ................... B23K 26/18
219/121.67
4,098,155 A * 7/1978 Insolio .................. C03B 33/027
83/485
(Continued)

FOREIGN PATENT DOCUMENTS

CN 1359784 A 7/2002
CN 1634782 A 7/2005
(Continued)

OTHER PUBLICATIONS

Taiwanese Search and Office Action dated Oct. 25, 2016 for Taiwan Patent Application No. 102101761; Kyung-Hoe Heo, et al.
(Continued)

*Primary Examiner* — Jason Daniel Prone
*Assistant Examiner* — Richard D Crosby, Jr.
(74) *Attorney, Agent, or Firm* — Lee & Morse, P.C.

(57) ABSTRACT

A cell cutting device that cuts a mother substrate for display devices includes a fixing unit configured to move in a state where the mother substrate for display devices is fixed on the fixing unit, a cutter configured to perform a cutting process on the mother substrate for display devices and the cutter faces a surface of the mother substrate during the cutting process, a cutter driving unit driving the cutter in a state where the cutter is fixed thereon, and a buffer member arranged on another surface of the mother substrate to correspond to the cutter. The other surface is opposite the surface facing the cutter.

18 Claims, 8 Drawing Sheets

(51) Int. Cl.
  *B26D 7/20* (2006.01)
  *B26D 5/00* (2006.01)
  *B26D 3/08* (2006.01)
  *B26D 1/01* (2006.01)
  *B26D 1/10* (2006.01)
  *B26F 1/38* (2006.01)

(52) U.S. Cl.
  CPC ............ *B26D 5/007* (2013.01); *B26D 7/015* (2013.01); *B26D 7/20* (2013.01); *B26F 1/3813* (2013.01); *H01L 2251/566* (2013.01); *Y10T 83/0207* (2015.04); *Y10T 83/0467* (2015.04); *Y10T 83/222* (2015.04); *Y10T 83/533* (2015.04); *Y10T 83/654* (2015.04); *Y10T 83/6563* (2015.04)

(56) References Cited

U.S. PATENT DOCUMENTS

| | | | | |
|---|---|---|---|---|
| 4,210,043 | A * | 7/1980 | Urion | B26D 1/105 83/175 |
| 4,210,052 | A * | 7/1980 | Fisher | B26D 3/085 83/881 |
| 4,736,661 | A | 4/1988 | Shirai | |
| 5,038,654 | A * | 8/1991 | Mackey | B26D 3/08 83/361 |
| 5,040,342 | A * | 8/1991 | McGuire | B24B 9/107 451/38 |
| 5,069,099 | A | 12/1991 | Fulton | |
| 5,253,561 | A * | 10/1993 | Wynn | B26D 3/085 83/346 |
| 5,924,618 | A | 7/1999 | Doak | |
| 6,640,855 | B2 * | 11/2003 | Giles | B27B 27/00 144/2.1 |
| 7,542,125 | B2 | 6/2009 | Kim et al. | |
| 7,993,476 | B2 * | 8/2011 | Nakazono | B32B 41/00 156/252 |
| 8,292,684 | B2 | 10/2012 | Kim et al. | |
| 8,316,749 | B2 * | 11/2012 | Rimai | B26D 1/08 412/16 |
| 8,621,968 | B1 * | 1/2014 | Pederson | B26D 1/30 83/410.9 |
| 8,709,567 | B2 | 4/2014 | Kitagawa et al. | |
| 8,939,337 | B2 * | 1/2015 | Roell | C03B 33/033 225/103 |
| 2003/0223030 | A1 | 12/2003 | Byun et al. | |
| 2004/0012734 | A1 | 1/2004 | Yamanaka et al. | |
| 2005/0199337 | A1 | 9/2005 | Nishikubo et al. | |
| 2007/0195634 | A1 * | 8/2007 | Lee | B23K 26/0604 365/230.05 |
| 2007/0214925 | A1 * | 9/2007 | Nishio | B28D 1/226 83/401 |
| 2008/0011802 | A1 | 1/2008 | Chen et al. | |
| 2008/0176477 | A1 * | 7/2008 | Hwang | G02F 1/133305 445/24 |
| 2008/0277375 | A1 * | 11/2008 | Paek | G02F 1/167 216/17 |
| 2008/0286889 | A1 * | 11/2008 | Chang | G02F 1/133555 438/30 |
| 2010/0011925 | A1 | 1/2010 | Lim et al. | |
| 2011/0058128 | A1 | 3/2011 | Adachi et al. | |
| 2011/0085125 | A1 | 4/2011 | Kimura et al. | |
| 2011/0193067 | A1 | 8/2011 | Lee et al. | |
| 2011/0266331 | A1 * | 11/2011 | Copperthite | B23K 20/004 228/155 |
| 2012/0062807 | A1 | 3/2012 | Baek et al. | |
| 2012/0247291 | A1 * | 10/2012 | Kawada | C03B 33/0222 83/33 |
| 2014/0248745 | A1 * | 9/2014 | Wu | H01L 24/97 438/114 |
| 2016/0043369 | A1 | 2/2016 | Zeng et al. | |
| 2016/0185647 | A1 * | 6/2016 | Vogt | C03B 33/10 428/43 |

FOREIGN PATENT DOCUMENTS

| | | |
|---|---|---|
| JP | 2010-37194 | 2/2010 |
| JP | 2011-165654 | 8/2011 |
| KR | 10-2002-0050116 A | 6/2002 |
| KR | 10-2005-0082449 A | 8/2005 |
| KR | 10-2006-0069881 | 6/2006 |
| KR | 10-2008-0099381 A | 11/2008 |
| KR | 10-0989125 B1 | 10/2010 |
| KR | 10-2011-0133881 A | 12/2011 |
| TW | 2008 04903 A | 1/2008 |

OTHER PUBLICATIONS

Chinese Office action dated Dec. 28, 2015 for CN 201210441623.3; Kyung-Hoe Heo, et al.

Korean Office Action dated Jan. 29, 2019.

* cited by examiner

CELL CUTTING DEVICE FOR DISPLAY DEVICES

CROSS-REFERENCE TO RELATED APPLICATIONS

This is a divisional application based on pending application Ser. No. 13/688,382, filed Nov. 29, 2012, the entire contents of which is hereby incorporated by reference.

This application claims the benefit of Korean Patent Application No. 10-2012-0080255, filed on Jul. 23, 2012, in the Korean Intellectual Property Office, the disclosure of which is incorporated herein in its entirety by reference.

BACKGROUND

Recently, display devices have been used in various fields. Among the display devices, flat panel display devices are expanding their applicable fields due to portability and the possibility of combining multiple functions.

SUMMARY

Embodiments may be realized by providing a cell cutting device for display devices, which cuts a mother substrate for display devices including a plurality of cells in cell units, the cell cutting device includes a fixing unit configured to move in a state where the mother substrate for display devices is fixed on the fixing unit, a cutter configured to perform a cutting process of the mother substrate for display devices, and disposed to face a surface of the mother substrate during the cutting process, a cutter driving unit driving the cutter in a state where the cutter is fixed thereon, and a buffer member disposed on a surface of the mother substrate, which is opposite to the surface facing the cutter, to correspond to the cutter.

The fixing unit may include a plurality of fixing members for fixing the mother substrate for display devices, and a plurality of connecting members connected respectively to the fixing members and formed elongated. The cutter may be attached to a lower surface of the cutter driving unit, and the cutter driving unit may be configured to move the cutter linearly in a thickness direction of the mother substrate for display devices.

The fixing unit may be disposed on a stage, and the stage may be linearly moved and rotated. The cell cutting device may further include a rotary driving unit and a driving axis, wherein the rotation of the stage may be controlled by the rotary driving unit and the stage linearly moves along the driving axis. The buffer member may be disposed on a support member.

The buffer member may be disposed between the mother substrate for display device and the support member. The cell cutting device may further include alignment cameras disposed adjacent to the cutter to identify an alignment state of the cutter and the mother substrate for display devices. The alignment cameras may be formed adjacent to a side of the mother substrate and the other side of the mother substrate, which faces the side.

An alignment mark may be formed on the mother substrate for display devices, and the alignment cameras may identify the alignment state of the cutter and the mother substrate by using the alignment mark. The alignment cameras may include a first camera and a second camera that is closer to the cutter than the first camera, and the first camera firstly may identify the alignment state of the cutter and the mother substrate and the second camera then identify the alignment state of the mother substrate.

An alignment identifying accuracy of the second camera may be higher than an alignment identifying accuracy of the first camera. The cell cutting device may further include alignment members disposed to face side surfaces of the mother substrate. The alignment members may include a servo motor to compress the side surfaces of the mother substrate so as to control the movement of the mother substrate. The alignment members may be disposed to face a side surface of the mother substrate and an opposite side surface.

The buffer member may be supplied in a roll-to-roll type by using a supply roll and a recovery roll. The cell cutting device may further include a tension-maintaining member disposed between the supply roll and the recovery roll for maintaining a tension of the buffer member. The cutter may have a length that is at least equal to or greater than a width of the mother substrate in a direction.

The plurality of cells on the mother substrate may be used to manufacture a plurality of flexible display devices. The plurality of cells on the mother substrate may be used to manufacture a plurality of organic light-emitting display devices.

Embodiments may also be realized by providing a method of manufacturing a display device by using a cell cutting device including a fixing unit, a cutter, a cutter driving unit, and a buffer member, the method including preparing a mother substrate including a plurality of cells for forming display devices, moving the fixing unit gradually toward the cutter in a state where the mother substrate is fixed on the fixing unit, and cutting and separating the cells of the mother substrate by repeatedly moving the cutter in a thickness direction of the mother substrate by a driving of the cutter driving unit.

When the cutter repeatedly moves in the thickness direction of the mother substrate, a buffer member may be disposed on a surface of the mother substrate, which is opposite to a surface facing the cutter, to correspond to the cutter. The cutter may be formed to have a length that is equal to or greater than a width of the mother substrate in a direction, and the cutter may cut the entire width of the mother substrate in the direction through one cutting process.

The mother substrate may include a display panel, a first protective film disposed on a surface of the display panel, and a second protective film disposed on an opposite surface to the surface of the display panel. The method may further include performing a cutting process for forming cutting recesses in the first protective film disposed on the surface of the display panel without affecting the display panel by controlling the movement of the cutter.

Each of the cells on the mother substrate may include a pad unit, the method may further include removing the protective film disposed on the pad unit by using the cutting recesses. The display panel may include: a substrate; a first electrode disposed on the substrate; an intermediate layer disposed on the first electrode and comprising an organic emission layer; and a second electrode disposed on the intermediate layer. The substrate may include a flexible material.

BRIEF DESCRIPTION OF THE DRAWINGS

Features will become more apparent to those of ordinary skill in the art by describing in detail exemplary embodiments thereof with reference to the attached drawings in which.

DETAILED DESCRIPTION

Figure 1:
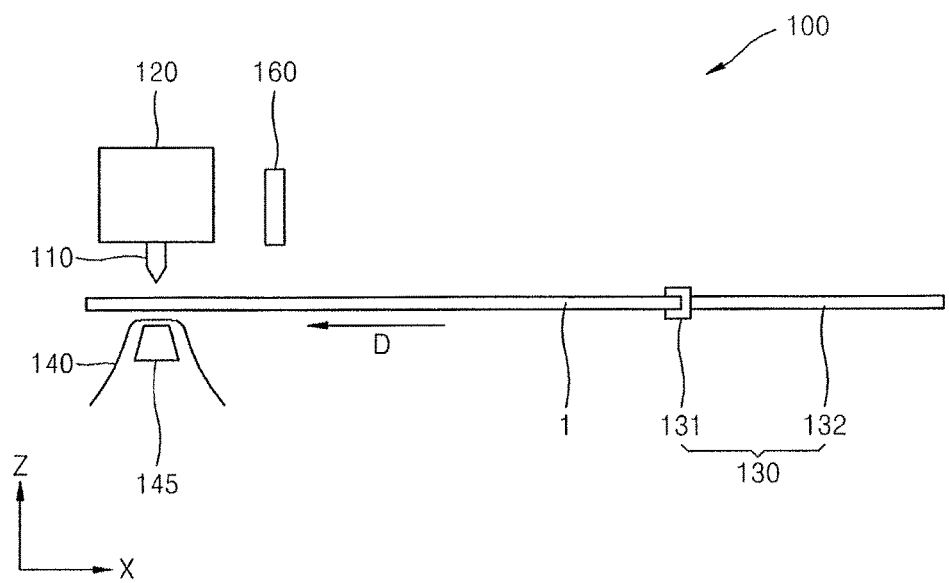
FIG. 1 is a schematic side view of a cell cutting device for display devices, according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Expressions such as "at least one of," when preceding a list of elements, modify the entire list of elements and do not modify the individual elements of the list. In the figures, the dimensions of layers and regions may be exaggerated for clarity of illustration. Like reference numerals refer to like elements throughout.

Figure 2:
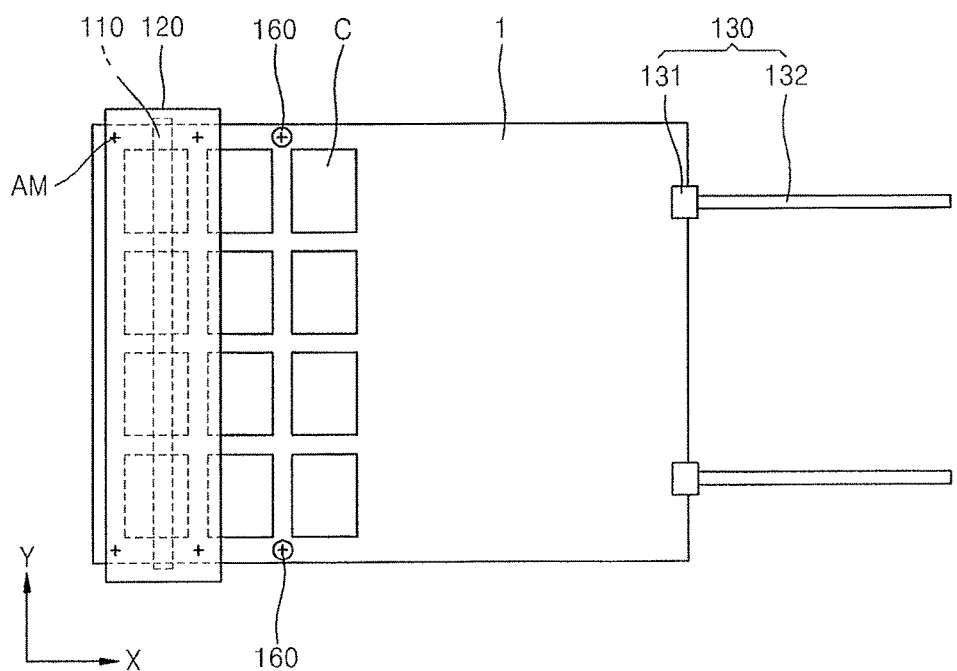
FIG. 2 is a plan view of the cell cutting device of FIG. 1.

FIG. 1 is a schematic side view of a cell cutting device 100 for display devices, according to an exemplary embodiment, and FIG. 2 is a plan view of the cell cutting device 100 shown in FIG. 1.

Referring to FIGS. 1 and 2, the cell cutting device 100 may include a fixing unit 130, a cutter 110, a cutter driving unit 120, a buffer member 140, a support member 145, and an alignment camera 160.

The fixing unit 130 fixes a mother substrate 1 for display devices fixed thereto. For example, the fixing unit 130 includes a plurality of fixing members 131 and a plurality of connection members 132. The fixing members 131 fix the mother substrate 1 while contacting, e.g., directly contacting, the mother substrate 1 for display devices. The fixing members 131 may be formed so as to grip an end of the mother substrate 1 therein. Two or more fixing members 131 may be disposed to effectively fix the mother substrate 1. For example, the fixing members 131 may be arranged along one side of the mother substrate 1. Each of the fixing members 131 is connected to the connection member 132. The connection member 132 is formed in an elongated shape so to, e.g., reduce the possibility of and/or prevent damage such as scratches on the mother substrate 1 when handling the mother substrate 1.

The fixing unit 130 is moveable while being coupled to the mother substrate 1 for display devices. For example, when the fixing unit 130 moves in a direction denoted by an arrow (D direction) shown in FIG. 1, the mother substrate 1 for display devices is moved together with the fixing unit 130. Accordingly, a cutting process of the mother substrate 1 for display devices may be sequentially performed.

The mother substrate 1 for display devices includes a plurality of cells C. Each of the cells C corresponds to one display device. That is, the mother substrate 1 for display devices is cut by the cell cutting device 100 in cell units to form a plurality of separated display devices.

The mother substrate 1 for display devices may include various kinds of display devices, e.g., the mother substrate 1 is for manufacturing flat panel display devices or flexible display devices.

The cutter 110 may have a sharp blade shape so as to cut the mother substrate 1 for display devices. For example, the cutter 110 may be configured to have a length that is at least equal to or greater than a width of the mother substrate 1 in a direction along which the length of the cutter 110 is measured. That is, as shown in FIG. 2, the cutter 110 is formed to have a length that is equal to or greater than a width of the mother substrate 1 in, e.g., a longitudinal direction.

The cutter 110 performs the cutting process while moving vertically that is, moving in a z-axis direction of FIG. 1 (e.g., capable of moving both in a direction away from and in a direction toward the mother substrate 1). Since the length of the cutter 110 may be equal to or greater than the width of the mother substrate 1 in a Y-axis direction in FIG. 2, the cutter 110 may cut the entire width of the mother substrate 1 in the longitudinal direction through one vertical movement. That is, since there is no need to perform the cutting process by moving the cutter 110 in the Y-axis direction of FIG. 2, the cells C may be cut constantly throughout the entire region on the mother substrate 1 for display devices. Since the cutter 110 reciprocates in an up-and-down direction, that is, in the Z-axis direction of FIG. 1, while being fixed in the X-axis or Y-axis direction, position control of the cutter 110 may be performed easily, and alignment of the cutter 110 relative to the mother substrate 1 for display devices may be conveniently controlled.

The cutter 110 moves while being attached to the cutter driving unit 120. That is, the cutter 110 is attached to a lower surface of the cutter driving unit 120, and the cutter driving unit 120 moves in the Z-axis direction of FIG. 1 so that the cutter 110 may perform the cell cutting process of the mother substrate 1 for display devices while linearly moving in the Z-axis direction. The cutter driving unit 120 may be formed of a material having excellent durability so as to sufficiently deal with repeated movements of the cutter 110. The cutter 110 and the cutter driving unit 120 may be firmly coupled to each other so that the cutter 110 may not be separated from the cutter driving unit 120 during the cutting process.

Although not shown in the drawings, the cutter 110 may be disposed to easily detach from the cutter driving unit 120 for replacement or repair after a predetermined process or a predetermined time.

The buffer member 140 is disposed on a lower portion of the mother substrate 1 for display devices. That is, as shown in FIG. 1, the buffer member 140 is disposed under a surface of the mother substrate 1, which is opposite to the surface facing the cutter 110, as shown in FIG. 1. The butter member 140 is configured to make the cutter 110 effectively perform the cutting process of the mother substrate 1 for display devices. That is, the buffer member 140 is disposed to correspond to the cutter 110 so as to directly support a lower surface of the mother substrate 1 when the cutter 110 performs the cutting process, and consequently, supports the cutter 110. As such, the cutter 110 may be protected during the cutting process, and a pressure may be applied to the lower portion, as well as the upper portion, of the mother substrate 1, thereby effectively performing the cutting process. For example, the buffer member 140 may be vertically aligned with the cutter 110 along the Z-axis direction. In addition, the mother substrate 1 may be supported during the cutting process so as to reduce the possibility of and/or prevent damage to a region other than the cut region of the mother substrate 1 and/or cracks from generating in the region.

The buffer member 140 has a width corresponding to the length of the cutter 110. That is, referring to FIG. 2, the buffer member 140 has a width that is equal to or greater than the length of the cutter 110 in the Y-axis direction.

The buffer member 140 may be formed of various materials, e.g., the buffer member 140 may be formed as a mat by using a flexible material so as to protect the cutter 110 and so as to reduce the possibility of damage to the mother substrate 1 for display devices.

The buffer member 140 may be placed on the support member 145. That is, the support member 145 is disposed under the mother substrate 1 for display devices so as to correspond to the cutter 110, and the buffer member 140 is disposed on the support member 145. That is, the buffer member 140 is between the support member 145 and the mother substrate 1 for display devices. The buffer member 140 may effectively support the mother substrate 1 and the cutter 110 by using the support member 145. A flat surface of the support member 145 may be vertically aligned, e.g., along the Z-axis direction, with the cutter 110.

The alignment camera 160 is disposed above the mother substrate 1 for display devices. The alignment camera 160 is disposed adjacent to the cutter 110 so as to identify the location of the mother substrate 1 before performing the cutting process using the cutter 110. That is, the alignment camera 160 identifies an alignment state of the mother substrate 1 and the cutter 110 during the cutting process while the mother substrate 1 is moved by the fixing unit 130. An alignment mark AM is formed on a region of the mother substrate 1 for the alignment camera 160 to easily identify the alignment state of the mother substrate 1 and the cutter 110.

One or more alignment cameras 160 may be disposed, and as shown in FIG. 2, a plurality of alignment cameras 160 may be provided so as to identify a region adjacent to one side of the mother substrate 1 and a region adjacent to another side of the mother substrate 1. For example, the alignment cameras 160 may be arranged to face opposing sides of one surface of the mother substrate 1.

According to an exemplary embodiment, the cell cutting device 100 includes the cutter 110 for cutting the mother substrate 1 in cell units. In particular, the length of the cutter 110 is equal to or greater than the width of the mother substrate 1 in a direction so as to perform the cutting process at once in the direction of the mother substrate 1.

Also, the cutting process is performed while the cutter 110 only moves linearly in an up-and-down direction while being fixed on the cutter driving unit 120 and the mother substrate 1 is moved by the fixing unit 130, and thus, the cell cutting process of the mother substrate 1 for forming large-sized display devices may be performed.

Also, the buffer member 140 is disposed under the mother substrate 1 to correspond to the cutter 110, and thus, the force of the cutter 110 may be effectively transmitted to the mother substrate 1 and the efficiency of the cutting process may be increased. The buffer member 140 may protect the cutter 110 so as to increase a replacement period of the cutter 110. In addition, the buffer member 140 supports the lower surface of the mother substrate 1, and thus, the possibility of deformation and/or cracks on an adjacent portion of the cutting line in the mother substrate 1 may be reduced and/or prevented during the cutting process of the mother substrate 1.

Figure 3:
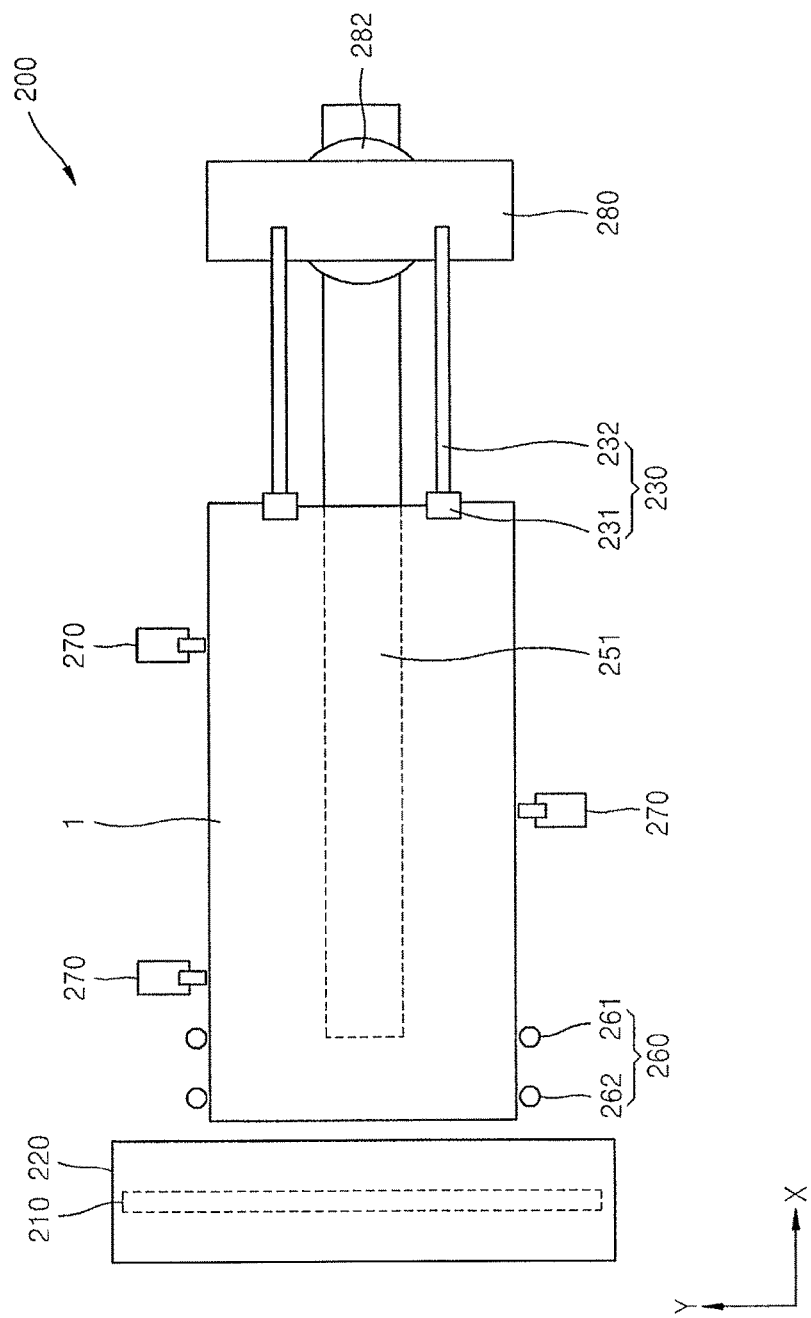
FIG. 3 is a schematic plan view of a cell cutting device for display devices, according to an exemplary embodiment.

FIG. 3 is a schematic plan view of a cell cutting device 200 for display devices, according to another exemplary embodiment. Elements that are different from those of the previous embodiment will be described for convenience of description.

Referring to FIG. 3, the cell cutting device 200 for display devices may include a fixing unit 230, a stage 280, a cutter 210, a cutter driving unit 220, a buffer member (not shown), a support member (not shown), an alignment camera 260, an alignment member 270, a driving axis 251, and a rotary driving unit 282.

The fixing unit 230 fixes the mother substrate 1 for display devices. Specifically, the fixing unit 230 includes a plurality of fixing members 231 and a plurality of connecting members 232. The fixing members 231 fix the mother substrate 1 while contacting the mother substrate 1, e.g., the fixing members 231 may each grip opposing surfaces of the mother substrate 1 therein. Two or more fixing members 231 may be disposed for performing the fixing operation efficiently. Each of the fixing members 231 is connected to one of the connecting members 232. The connecting members 232 are formed elongated to reduce the possibility of and/or prevent damage such as scratches on the mother substrate 1 while handling the mother substrate 1.

The fixing unit 230 is connected to the stage 280. In detail, an end portion of the each of the connecting members 232 is connected to the stage 280. The fixing unit 230 is moved while being connected to the stage 280. Also, the fixing unit 230 moves while being coupled to the mother substrate 1. That is, the mother substrate 1 is fixed on the fixing unit 230, and then, is moved gradually, e.g., toward the cutter 210 through movement of the stage 280 to perform the cutting process.

The mother substrate 1 for display devices includes a plurality of cells (not shown). Each of the cells (not shown) corresponds to one display device. That is, the mother substrate 1 is cut into cell units by using the cell cutting device 200 of the present embodiment to form a plurality of display devices.

The mother substrate 1 may include various kinds of display devices, for example, the mother substrate 1 may be a substrate for manufacturing flat panel display devices or flexible display devices.

The stage 280 may linearly move, e.g., toward the cutter 210 along the driving axis 251. In addition, the stage 280 may be rotated by a predetermined angle by the rotary driving unit 282. That is, when the mother substrate 1 is aligned, the stage 280 is rotated to a desired degree.

The cutter 210 has a sharp blade to cut the mother substrate 1 for display devices. Here, the cutter 210 is formed to have a length that is at least equal to or greater than a width of the mother substrate 1 in a direction. That is, as shown in FIG. 3, the cutter 210 may have a length that is equal to or greater than a width of the mother substrate 1 in the longitudinal direction.

The cutter 210 performs the cutting process while moving vertically. Here, since the length of the cutter 210 corresponds to the width of the mother substrate 1 in a Y-axis direction of FIG. 3, the cutting process corresponding to the entire width of the mother substrate 1 in the longitudinal direction is performed by one vertical movement of the cutter 210. That is, there is no need to perform the cutting process by moving the cutter 210 in the Y-axis direction in FIG. 3, and thus, the cell cutting process may be performed evenly throughout an entire area of the mother substrate 1.

The cutter 210 is moved while being attached to the cutter driving unit 220. The cutter 210 is attached to a lower surface of the cutter driving unit 220. The cutter driving unit 220 is formed of a material having excellent durability for the cutter 210 to perform repeated operations sufficiently, and the cutter 210 and the cutter driving unit 220 are firmly coupled to each other so that the cutter 210 may not be separated from the cutter driving unit 220 during the cutting process.

In addition, although not shown in FIG. 3, the cutter 210 is disposed to easily detach from the cutter driving unit 220 for replacement or repair after a predetermined process or a predetermined time.

Although not shown in FIG. 3, a buffer member may be placed on a support member as illustrated in FIG. 1. The buffer member (not shown) is disposed under the mother substrate 1 for display devices. That is, the buffer member is disposed on a surface of the mother substrate 1, which is opposite to a surface facing the cutter 210. The buffer member (not shown) is disposed on a portion corresponding to the cutter 210 so as to directly support the lower surface of the mother substrate 1 when the cutter 210 performs the cutting process, and accordingly, supports the cutter 210. The buffer member has a width corresponding to the length of the cutter 210.

The alignment camera 260 is disposed above the mother substrate 1 for display devices. The alignment camera 260 is disposed adjacent to the cutter 210 to identify the location of the mother substrate 1 before performing the cutting process using the cutter 210. The alignment camera 260 includes at least a first camera 261 and at least a second camera 262. The first camera 261 is farther from the cutter 210 than the second camera 262.

As shown in FIG. 3, a plurality of the first cameras 261 may be disposed in order to identify different sides or ends of the mother substrate. In addition, a plurality of the second cameras 262 may be disposed in order to identify different sides or ends of the mother substrate 1, as shown in FIG. 3.

The alignment camera 260 identifies whether the mother substrate 1 and the cutter 210 are aligned with each other during the cutting process in a state where the mother substrate 1 fixed by the fixing unit 230 is moved, e.g., is moved along the X-axis direction. In more detail, the first cameras 261 firstly identify the alignment of the mother substrate 1 and the cutter 210. Then, the second cameras 262 secondly identify the alignment of the mother substrate 1 and the cutter 210.

An alignment identifying accuracy of the second cameras 262 is higher than that of the first cameras 261. For example, the first cameras 261 identify the alignment locations of the mother substrate 1 and the cutter 210 within an error range of 100 μm, and the second cameras 262 identify the alignment locations of the mother substrate 1 and the cutter 210 within an error range of 40 μm. The cutting process may be performed efficiently through the gradual alignment identification by using the first and second cameras 261 and 262 and sequential alignment between the mother substrate 1 and the cutter 210. That is, the time taken to align the mother substrate 1 and the cutter 210 may be reduced less than that when one alignment camera is used, and the accuracy of the alignment may be improved.

Although not shown in FIG. 3, an alignment mark (not shown) may be formed on a region of the mother substrate 1 so as to make the identification by the alignment camera 260 easy, as shown in FIG. 2.

The alignment member 270 is disposed along sides of the mother substrate 1. A plurality of alignment members 270 may be disposed on the mother substrate 1 so as to improve the accuracy of the alignment between the mother substrate 1 and the cutter 210.

As described above, after identifying an alignment state of the mother substrate 1 and the cutter 210 by using the alignment camera 260, the mother substrate 1 is moved by driving the stage 280. By driving the stage 280 using the rotary driving unit 282 and the driving axis 251, the alignment between the mother substrate 1 and the cutter 210 may be controlled. In addition, the alignment of the mother substrate 1 and the cutter 210 is also controlled by using the alignment members 270 disposed on the side of the mother substrate 1. To do this, the alignment members 270 may be drivable, such as servo motors. That is, when the alignment members 270 move, a force is applied to the side surfaces of the mother substrate 1 so as to finely move the mother substrate 1.

In another embodiment, the alignment members 270 may apply the force to the side surfaces of the mother substrate 1 independently from the alignment camera 260 according to predetermined design values so as to finely move the mother substrate 1, when the alignment between the mother substrate 1 and the cutter 210 is in an abnormal state. Thus, the alignment between the mother substrate 1 and the cutter 210 may be easily performed.

The cell cutting device 200 for display devices, according to the present embodiment, includes the cutter 210 so as to cut the mother substrate 1 for display devices in cell units. In particular, since the length of the cutter 210 is equal to or greater than the width of the mother substrate 1 in a direction, the mother substrate 1 may be cut at once in one direction thereof.

In addition, since the cutting process is performed while the cutter 210 moves vertically while being fixed on the cutter driving unit 220 and the mother substrate 1 is moved by the fixing unit 230, the cell cutting process of the large-sized mother substrate 1 may be performed conveniently.

Here, the stage 280 is moved by using the driving axis 251 and the rotary driving unit 282 in a state where the fixing unit 230 is disposed on the stage 280 so as to control the movement of the mother substrate 1.

In addition, the alignment of the mother substrate 1 and the cutter 210 may be easily performed by sequentially identifying an alignment state by using the first cameras 261 and the second cameras 262. In particular, the plurality of alignment members 270 disposed on the sides of the mother substrate 1 may perform the alignment of the mother substrate 1 with the cutter 210 in connection with the alignment camera 260 or independently from the alignment camera 260, and thus, the cutting process of the mother substrate 1 may be accurately controlled.

Figure 4:
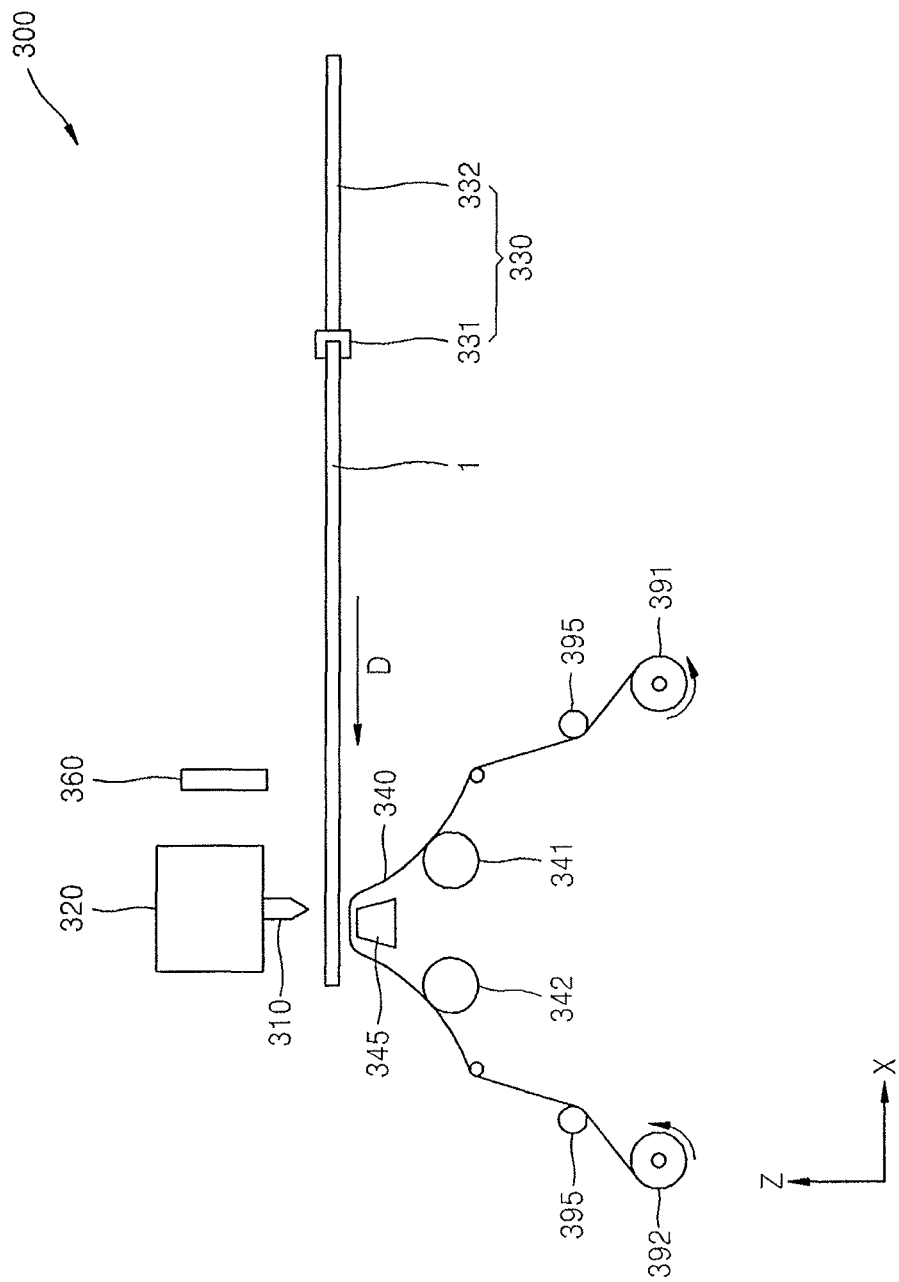
FIG. 4 is a schematic plan view of a cell cutting device for display devices, according to an exemplary embodiment.

FIG. 4 is a schematic plan view of a cell cutting device 300 for display devices according to another exemplary embodiment. Differences from the previous embodiments will be described for convenience of description.

Referring to FIG. 4, the cell cutting device 300 for display devices includes a fixing unit 330, a cutter 310, a cutter driving unit 320, a buffer member 340, a support member 345, an alignment camera 360, a supply roll 391, and a recovery roll 392.

The fixing unit 330 fixes the mother substrate 1 for display devices. In detail, the fixing unit 330 includes a plurality of fixing members 331 and a plurality of connecting members 332. The fixing members 331 fix the mother substrate 1 while contacting the mother substrate 1, and two or more fixing members 331 may be disposed for performing the fixing operation efficiently. Each of the fixing members 331 is connected to the connecting member 332. The connecting member 332 is formed elongated to reduce the possibility of and/or prevent damage such as scratches on the mother substrate 1 while handling the mother substrate 1.

Although not shown in FIG. 4, the cell cutting device 300 of the present embodiment may include a stage (not shown) that is similar to the stage 280 described in the previous embodiment shown in FIG. 3, and the fixing unit 330 may be moved while connected to the stage. In addition, the stage linearly moves, e.g., toward the cutter 310 along a driving axis (not shown). Also, the stage may be rotated by a predetermined angle by a rotary driving unit (not shown). That is, the stage may be rotated to a desired angle when aligning the mother substrate 1 for display devices.

The mother substrate 1 for display devices includes a plurality of cells (not shown). Each of the cells corresponds to one display device. That is, the mother substrate 1 is cut in cell units by using the cell cutting device 300 of the present embodiment to form a plurality of display devices.

The cutter 310 has a sharp blade to cut the mother substrate 1 for display devices. Here, the cutter 310 is formed to have a length that is at least equal to or greater than a width of the mother substrate 1 in a direction.

The cutter 310 performs the cutting process while moving vertically. Here, since the length of the cutter 310 corresponds to the width of the mother substrate 1 in a direction, the cutting process corresponding to the entire width of the mother substrate 1 in the longitudinal direction is performed by one vertical movement of the cutter 310.

The cutter 310 is moved while being attached to the cutter driving unit 320. That is, the cutter 310 is attached to a lower surface of the cutter driving unit 320, and the cutter 310 performs the cutting process of the mother substrate 1 while moving linearly by the linear movement of the cutter driving unit 320 in an up-and-down direction.

The cutter driving unit 320 is formed of a material having excellent durability for the cutter 310 to perform repeated operations sufficiently, and the cutter 310 and the cutter driving unit 320 are firmly coupled to each other so that the cutter 310 may not be separated from the cutter driving unit 320 during the cutting process.

In addition, although not shown in FIG. 4, the cutter 310 is disposed to easily detach from the cutter driving unit 320 for replacement or repair after a predetermined process or a predetermined time.

The buffer member 340 is disposed under the mother substrate 1 for display devices. That is, the buffer member 340 is disposed on a surface of the mother substrate 1, which is opposite to a surface facing the cutter 310. The buffer member 340 is disposed on a portion corresponding to the cutter 310 so as to directly support the lower surface of the mother substrate 1 when the cutter 310 performs the cutting process, and accordingly, supports the cutter 310. The buffer member 340 has a width corresponding to the length of the cutter 310.

In addition, the buffer member 340 is placed on the support member 345. That is, the support member 345 is disposed under the mother substrate 1 to correspond to the cutter 310, and the buffer member 340 is disposed on the support member 345. That is, the buffer member 340 is between the support member 345 and the mother substrate 1 for display devices. By using the support member 345, the buffer member 340 may efficiently support the mother substrate 1 and the cutter 310. A flat surface of the support member 345 may be vertically aligned with the cutter 310 so that during the cutting process the cutter 310 moves toward the flat surface of the support member 345.

The buffer member 340 may be supplied in a roll-to-roll type manner. As an example, the buffer member 340 may be continuously supplied by using the supply roll 391 and the recovery roll 392.

Due to the repeated cutting processes of the cutter 310, the buffer member 340 is continuously compressed, and thus, the buffer member 340 may be deformed or characteristics thereof are changed. Accordingly, it may not be easy to perform the buffering function effectively. In the present embodiment, the buffer member 340 may be moved continuously in the roll-to-roll type if desired, thereby maintaining the characteristics of the buffer member 340 evenly.

A first support roll 341 may be disposed between the supply roll 391 and the support member 345, and a second support roll 342 may be disposed between the recovery roll 392 and the support member 345 so as to reduce the possibility of and/or prevent the buffer member 340 from sagging or bending and to dispose the buffer member 340 accurately on the support member 345.

Also, a tension-maintaining member 395 may be disposed to maintain an appropriate tension of the buffer member 340 on the support member 345. The tension-maintaining member 395 may include a plurality of tension-maintaining members 395. One tension-maintaining member 395 may be disposed between the supply roll 391 and the support member 345, e.g., between the supply roll 391 and the first support roll 341. Another tension-maintaining member 395 may be disposed between the recovery roll 392 and the support member 345, e.g., the recovery roll 392 and the second support roll 342.

The alignment camera 360 is disposed above the mother substrate 1 for display devices. The alignment camera 360 is disposed adjacent to the cutter 310 to identify the location of the mother substrate 1 before performing the cutting process by using the cutter 310. Although not shown in FIG. 4, the alignment camera 360 may include a first camera (not shown) and a second camera (not shown) to identify the location sequentially.

Although not shown in FIG. 4, an alignment mark (not shown) may be formed on a region of the mother substrate 1 for the alignment camera 360 to easily identify the location.

Also, although not shown in FIG. 4, as shown in FIG. 3, an alignment member (not shown) may be disposed on a side surface of the mother substrate 1 for display devices.

The cell cutting device 300 of the present embodiment includes the cutter 310 to cut the mother substrate 1 in cell units. In particular, the length of the cutter 310 is equal to or greater than the width of the mother substrate 1 in one direction to perform the cutting process at once in the width direction of the mother substrate 1.

Also, since the cutting process is performed while the cutter 310 linearly moves in an up-and-down direction while being fixed on the cutter driving unit 320 and the mother substrate 1 is moved by the fixing unit 330 in a direction denoted by an arrow (D direction of FIG. 4), the cell cutting process may be performed easily on the large-sized mother substrate 1.

In addition, since the buffer member 340 may be disposed under the mother substrate 1 to correspond to the cutter 310 so that the power of the cutter 310 may be effectively transferred to the mother substrate 1, the efficiency of the cutting process may be increased. Also, the buffer member 340 may protect the cutter 310 so as to increase a replacement period of the cutter 310. In addition, when the cutter 310 performs the cutting process of the mother substrate 1, the buffer member 340 supports the lower surface of the mother substrate 1 to reduce the possibility and/or prevent regions adjacent to cutting lines of the mother substrate 1 from being deformed or cracks from generating.

In particular, since the buffer member 340 may be continuously supplied at desired times in desired amounts in the roll-to-roll type, the characteristics of the buffer member 340 may be evenly maintained. In addition, an appropriate tensile force may be applied to the buffer member 340 by the tension-maintaining member 395, thereby controlling the characteristics of the buffer member 340 according to processing conditions.

FIGS. 5A through 5L are cross-sectional views depicting stages in a method of manufacturing a display device, according to an exemplary embodiment.

Figure 5A:
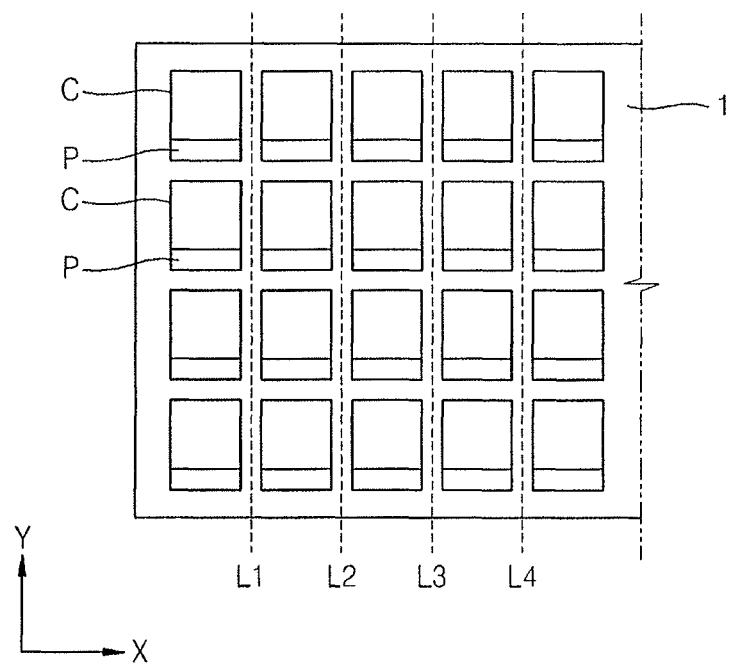
FIGS. 5A through 5L are cross-sectional views depicting stages in an exemplary method of manufacturing a display device.

Referring to FIG. 5A, the mother substrate 1 for display devices is prepared. The mother substrate 1 for display devices includes a plurality of cells C. Each of the cells C corresponds to one display device. In addition, each of the cells C includes a pad unit P. The cell cutting device 100 for display devices performs a cutting process. Alternatively, the cell cutting device 200 or 300 for display devices according to the other exemplary embodiment may be used or a cell cutting device according to other embodiments may be used. For convenience of description, in the present embodiment, the cutting process is performed by using the cell cutting device 100.

In detail, the cutting process is performed based on cutting lines L1, L2, L3, and L4 shown in FIG. 5A. As described above, since the length of the cutter 110 corresponds to the width of the mother substrate 1 in a direction, a region corresponding to the cutting line L1 is cut by one cutting process. In addition, the fixing unit 130 is driven to gradually move the mother substrate 1 to perform the other cutting processes on the cutting lines L2, L3, and IA.

Figure 5B:
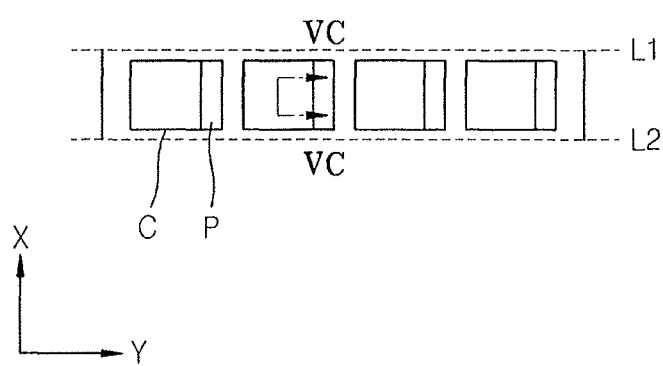

Through the above cutting processes, the mother substrate 1 is divided based on the cutting lines L1 through L4, as shown in FIG. 5B, and a plurality of cell assemblies in which cells C are arranged in a direction are generated.

Figure 5C:
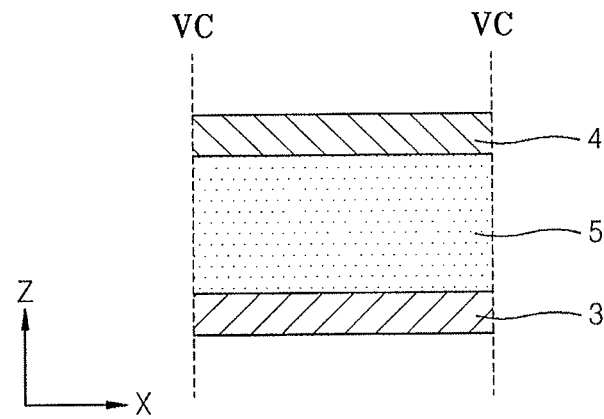

FIG. 5C is a cross-sectional view of a cell assembly, taken along line VC-VC of FIG. 5B. In detail, each of the cells C includes a display panel 5, a first protective film 3, and a second protective film 4. The display panel 5 may include various kinds of display panels.

FIGS. 5D through 5G show various embodiments of the display panel 5. This will be described below in more detail.

Figure 5D:
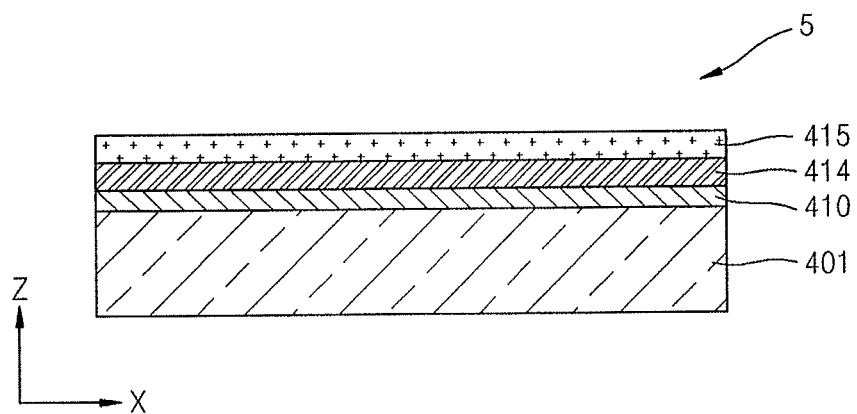

Referring to FIG. 5D, the display panel 5 includes a substrate 401, a first electrode 410, an intermediate layer 414, and a second electrode 415.

The configuration of each member will be described in detail as follows:

The substrate 401 may be formed of a flexible material, e.g., a transparent plastic material.

The first electrode 410 is formed on the substrate 401. The first electrode 410 may include indium tin oxide (ITO), indium zinc oxide (IZO), ZnO, or $In_2O_3$. In addition, the first electrode 410 may further include a reflective layer formed of Ag, Mg, Al, Pt, Pd, Au, Ni, Nd, Ir, Cr, Li, Yb, and/or Ca.

Although not shown in the drawings, a buffer layer (not shown) may be formed between the substrate 401 and the first electrode 410. The buffer layer may prevent impurities from infiltrating into the substrate 401, and provides a flat surface on the substrate 401. The buffer layer may be formed of various materials that may perform the above functions. For example, the buffer layer may be formed as a stacked structure including a plurality of inorganic materials such as silicon oxide, silicon nitride, silicon oxynitride, aluminum oxide, aluminum nitride, titanium oxide, titanium nitride, and/or organic materials such as polyimide, polyester, and/or acryl.

The intermediate layer 414 is formed on the first electrode 410. The intermediate layer 414 may include a light emitting layer such as an organic emission layer for emitting visible rays. The intermediate layer 414 may be formed as a low-molecular weight organic layer or a high-molecular weight organic layer. When the intermediate layer 414 is formed as a low-molecular weight organic layer, a single or multi-layer structure including a hole injection layer (HIL), a hole transport layer (HTL), an organic emission layer, an electron transport layer (ETL), and an electron injection layer (EIL) may be formed.

The HIL may be formed of phthalocyanine compound such as copper phthalocyanine, or TCTA, m-MTDATA, or m-MTDAPB that is star-bust type amine.

The HTL may be formed of N,N'-bis(3-methylphenyl)-N,N'-diphenyl-[1,1-biphenyl]-4,4'-diamine (TPD), N,N'-di(naphthalene-1-yl)-N,N'-diphenyl benzidine (NPD), and the like.

The EIL may be formed of a material such as LiF, NaCl, CsF, $Li_2O$, BaO, or Liq.

The ETL may be formed of $Alq_3$.

The organic emission layer may include a host material and a dopant material.

The second electrode 415 is formed on the intermediate layer 414. The second electrode 415 may be formed of metal such as Ag, Mg, Al, Pt, Pd, Au, Ni, Nd, Ir, Cr, Li, or Ca.

Figure 5E:
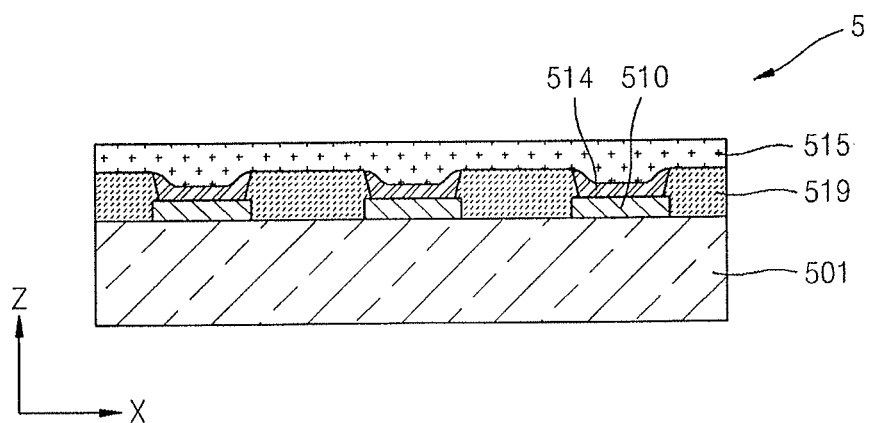

FIG. 5E is a cross-sectional view showing another embodiment of the display panel 5. Referring to FIG. 5E, the display panel 5 includes a substrate 501, a first electrode 510, a pixel-defining layer 519, an intermediate layer 514, and a second electrode 515. The configuration of each member will be described in detail. For convenience of description, differences from the previous embodiment will be described.

The substrate 501 may be formed of a flexible material, and the first electrode 510 is formed on the substrate 501.

The pixel-defining layer 519 is formed on the first electrode 510 by using an insulating material. Here, the pixel-defining layer 519 has an opening through which an upper surface of the first electrode 510 may be exposed.

The intermediate layer 514 is formed on the exposed upper surface of the first electrode 510. The intermediate layer 514 may include an organic emission layer for emitting visible rays.

The second electrode 515 is formed on the intermediate layer 514 and the pixel-defining layer 519.

Figure 5F:
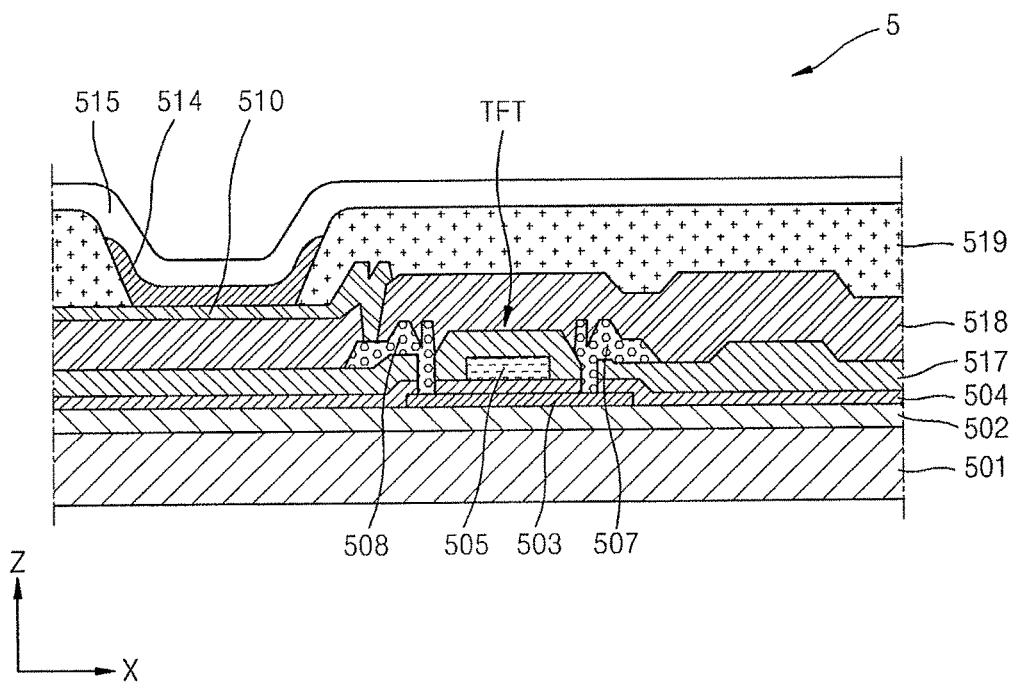

FIG. 5F is a cross-sectional view showing another embodiment of the display panel 5.

Referring to FIG. 5F, the display panel 5 includes a thin film transistor (TFT) formed on the substrate 501. The TFT includes an active layer 503, a gate electrode 505, a source electrode 507, and a drain electrode 508.

A buffer layer 502 is formed on the substrate 501, which substrate 501 may be formed of a flexible material. As described above, the buffer layer 502 may be omitted.

The active layer 503 may be formed on the buffer layer 502 with a predetermined pattern. The active layer 503 may be formed of inorganic semiconductor such as amorphous silicon or polysilicon, or organic semiconductor, and includes a source region, a drain region, and a channel region. The source region and the drain region of the active layer 503 may be formed by doping the amorphous silicon or the polysilicon with Group-III or group-V impurities.

A gate insulating layer 504 is formed on the active layer 503, and the gate electrode 505 is formed on an upper predetermined region of the gate insulating layer 504. The gate insulating layer 504 insulates the active layer 503 from the gate electrode 505, and may be formed of an organic material or an inorganic material such as $SiN_x$ and $SiO_2$.

The gate electrode 505 may include, e.g., Au, Ag, Cu, Ni, Pt, Pd, Al, or Mo, and may include an alloy such as Al:Nd and Mo:W. However, embodiments are not limited thereto, e.g., the gate electrode 505 may be formed of various materials in consideration of attachability with adjacent layers, flatness, electrical resistance, and processability.

An interlayer dielectric 517 is formed on the gate electrode 505. The interlayer dielectric 517 and the gate insulating layer 504 are formed to expose the source region and the drain region of the active layer 503, and the source electrode 507 and the drain electrode 508 are formed to respectively contact the exposed source region and the drain region of the active layer 503.

The source electrode 507 and the drain electrode 508 may be formed of various conductive materials, and may have single or multi-layered structures.

A passivation layer 518 is formed on the TFT. In more detail, the passivation layer 518 is formed on the source electrode 507 and the drain electrode 508.

The passivation layer 518 is formed to expose a predetermined region of the drain electrode 508 so as to not completely cover the drain electrode 508. The first electrode 510 is formed to be connected to the exposed drain electrode 508.

The pixel-defining layer 519 is formed of an insulating material on the first electrode 510. The pixel-defining layer 519 is formed to expose a predetermined region of the first electrode 510, and the intermediate layer 514 is formed to contact the exposed region of the first electrode 510. In addition, the second electrode 515 is formed to be connected to the intermediate layer 514.

A sealing member (not shown) may be disposed on the second electrode 515. The sealing member is formed to protect the intermediate layer 514 and the other layers from external moisture or oxygen. The sealing member may be formed as a stacked structure including a plurality of layers of a plastic material or an organic material and an inorganic material.

Figure 5G:
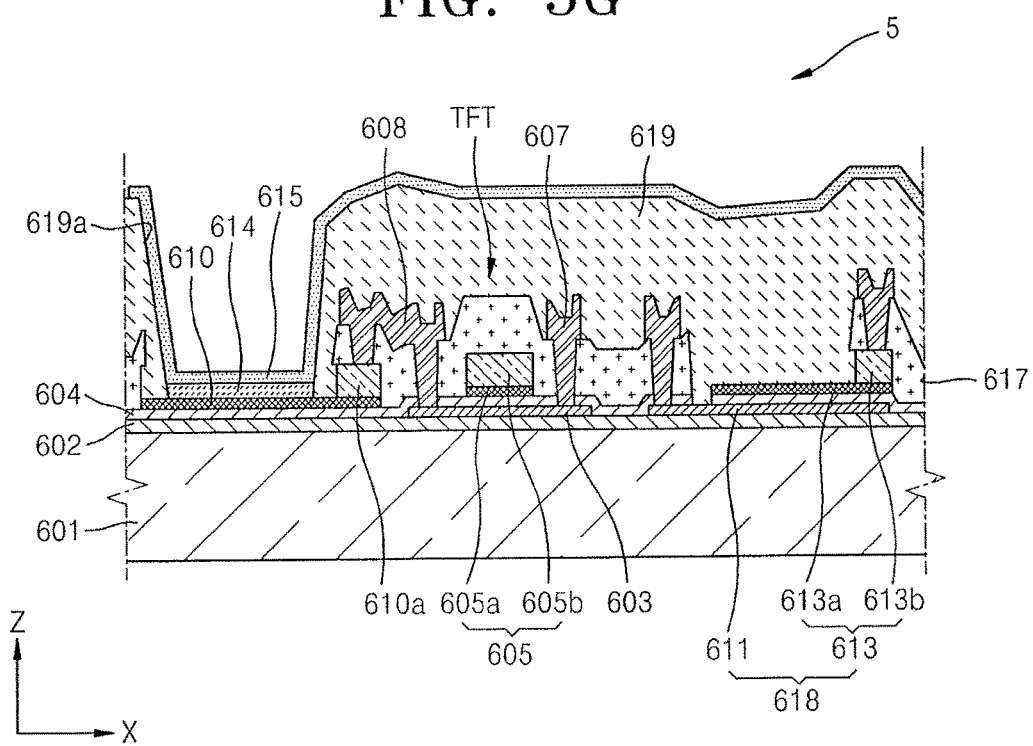

FIG. 5G is a cross-sectional view showing another embodiment of the display panel 5. Referring to FIG. 5G, the display panel 5 includes a TFT and a capacitor 618 formed on a substrate 601. The TFT includes an active layer 603, a gate electrode 605, a source electrode 607, and a drain electrode 608.

A buffer layer 602 is formed on the substrate 601, which substrate 601 may be formed of a flexible material. The active layer 603 having a predetermined area is formed on the buffer layer 602. In addition, a first capacitor electrode 611 is formed on the buffer layer 602. The first capacitor electrode 611 may be formed of the same material as that of the active layer 603.

A gate insulating layer 604 is formed on the buffer layer 602 so as to cover the active layer 603 and the first capacitor electrode 611.

The gate electrode 605, a first electrode 610, and a second capacitor electrode 613 are formed on the gate insulating layer 604.

The gate electrode 605 includes a first conductive layer 605a and a second conductive layer 605b.

The first electrode 610 may be formed of the same material as that of the first conductive layer 605a. A conductive portion 610a is disposed on a predetermined region of an upper portion of the first electrode 610, and the conductive portion 610a is formed of the same material as that of the second conductive layer 605b.

The second capacitor electrode 613 includes a first layer 613a and a second layer 613b. The first layer 613a is formed of the same material as that of the first conductive layer 605a, and the second layer 613b is formed of the same material as that of the second conductive layer 605b. The second layer 613b is formed on the first layer 613a to be smaller than the first layer 613a. In addition, the second capacitor electrode 613 overlaps with the first capacitor electrode 611, and is smaller than the first capacitor electrode 611.

An interlayer dielectric 617 is formed on the first electrode 610, the gate electrode 605, and the second capacitor electrode 613. The source electrode 607 and the drain electrode 608 are formed on the interlayer dielectric 617. The source electrode 607 and the drain electrode 608 are connected to the active layer 603.

Also, one of the source electrode 607 and the drain electrode 608 is electrically connected to the first electrode 610, and FIG. 5G shows that the drain electrode 608 is electrically connected to the first electrode 610. In more detail, the drain electrode 608 contacts the conductive portion 610a.

A pixel-defining layer 619 is formed on the interlayer dielectric 617 so as to cover the source electrode 607, the drain electrode 608, and the capacitor 618.

The pixel-defining layer 619 has a predetermined opening 619a corresponding to a portion of the upper surface of the first electrode 610. An intermediate layer 614 is formed on the first electrode 610 that is exposed through the opening 619a of the pixel-defining layer 619.

The second electrode 615 is formed on the intermediate layer 614. Although not shown in FIG. 5G, a sealing member (not shown) may be disposed on the second electrode 615. The sealing member is formed to protect the first electrode 610, the intermediate layer 614, or the second electrode 615 from external impurities or external shock, and may be formed of glass or a metal thin film, or may have a stacked structure including an organic material and an inorganic material.

Figure 5H:
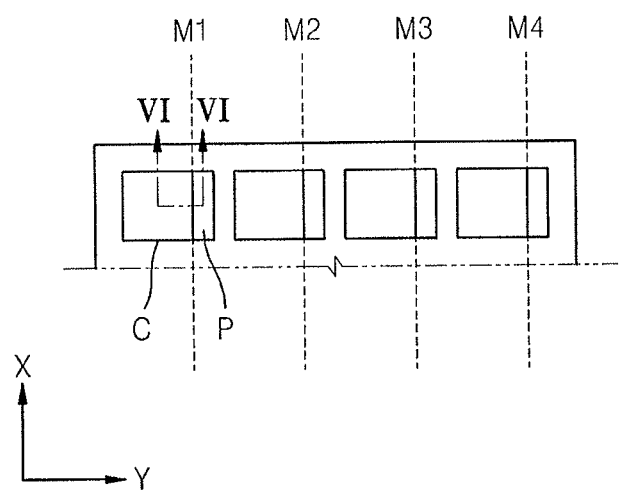
Figure 5I:
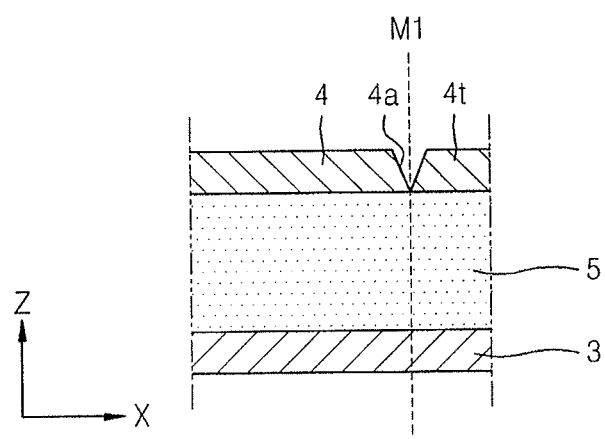

After that, referring to FIGS. 5H and 5I, the cutting process of the cell C assembly shown in FIG. 5B is performed. In more detail, the cutting process is performed based on cutting lines M1, M2, M3, and M4, and the above cutting process is not a full cutting for separating cells C, but a half-cutting process for forming cutting recesses 4a in the second protective film 4. The half-cutting process is performed by using the cutting process by the up-and-down movement of the cutter 110. Since the cutter 110 is fixed on the cutter driving unit 120, the up-and-down movement of the cutter 110 may be controlled precisely, and accordingly, the half-cutting process may be performed easily, and other regions than the cutting recesses 4a in each of the cells C may not be damaged.

In more detail, as shown in FIGS. 5h and 5I, the cutting recesses 4a are formed in the second protective film 4, and a pad corresponding film region 4t of the second protective film 4 disposed on the pad unit P in each of the cells C is separated from remaining region of the second protective film 4 based on the cutting recess 4a.

Figure 5J:
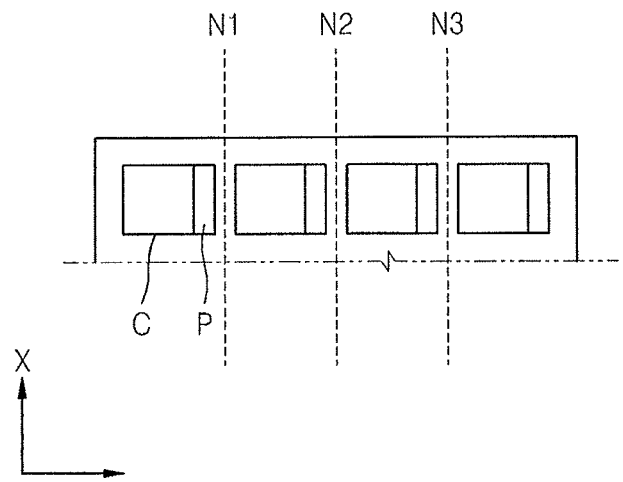

After that, referring to FIG. 5J, the cutting process is performed on each of the cells C. In more detail, the cutting process is performed based on cutting lines N1, N2, and N3.

For example, when the cutting process is performed as shown in FIG. 5J, four cells C are fabricated.

Figure 5K:
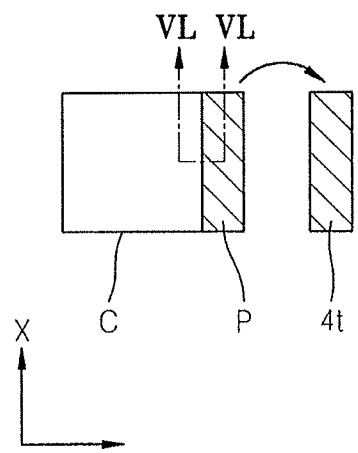
Figure 5L:
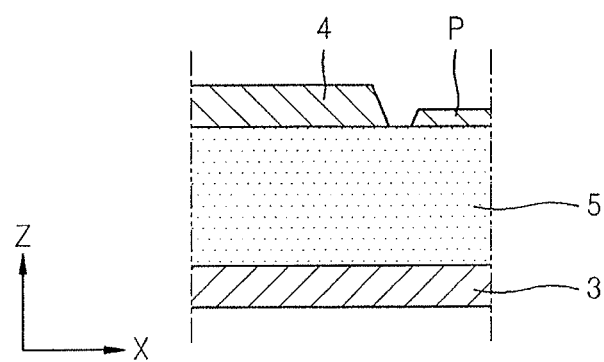

In addition, as shown in FIGS. 5K and 5L, the pad corresponding film region 4t of the second protective film 4 disposed on the pad unit P in each of the cells C is removed. The pad corresponding film region 4t may be easily removed by using the cutting recess 4a. Then, the pad unit P is exposed. The pad unit P is electrically connected to a circuit substrate for generating and transferring electric signals in post processes.

The cell cutting process of the mother substrate 1 for display devices may be may be easily performed by using the cell cutting device 100 as described above. In addition, the half-cutting process may be performed easily, and thus, a desired portion of the protective film may be removed conveniently. Further the display panel 5 may include the organic emission layer; however, embodiments are not limited thereto. For example, the display panel 5 may include a liquid crystal device.

By way of summation and review, a mother substrate for manufacturing a plurality of display devices at once may be used in order to improve a manufacturing efficiency for the display devices. The mother substrate for display devices, on which a plurality of cells corresponding to a plurality of display devices may be formed, may first be manufactured. Thereafter, a plurality of display devices corresponding to the cells may be manufactured by performing a cell cutting process on the mother substrate for display devices. The cell cutting process may be performed in various manners. However, there is a limitation in maintaining cutting properties for improving a processing efficiency, without damaging the mother substrate for display devices.

Embodiments relates to a cell cutting device for display devices and the method of manufacturing the display device, in which the cell cutting characteristics may be improved. In other words, embodiments relate to a cell cutting device for display devices, which is capable of improving cell cutting properties, and a method of manufacturing the display device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A cell cutting device for cutting a mother substrate for display devices that includes a plurality of cells, the cell cutting device comprising:
   a fixing unit configured to have the mother substrate fixed thereto during a cutting process, and configured to move the mother substrate in a first direction during the cutting process;
   a cutter configured to cut the mother substrate in a second direction that is a cutting direction of the mother substrate, the cutter facing a first surface of the mother substrate during the cutting process;
   a cutter driving unit fixed to the cutter, the cutter driving unit being configured to drive the cutter during the cutting process;
   a buffer member arranged facing a second surface of the mother substrate, opposite the first surface, the buffer member being positioned to correspond to the cutter during the cutting process; and
   a support member arranged on an opposite side of the buffer member from the second surface of the mother substrate such that the buffer member is interposed between the second surface of the mother substrate and the support member during the cutting process, wherein:
   a portion of the support member that faces the buffer member has a width in the first direction that is smaller than a width of the mother substrate in the first direction, and
   the buffer member has a width in the cutting direction that is equal to or greater than a width of the cutter in the cutting direction.

2. The cell cutting device of claim 1, wherein the fixing unit includes:
   a plurality of fixing members that fix the mother substrate, and
   a plurality of elongated connecting members connected to the fixing members, respectively.

3. The cell cutting device of claim 1, wherein the cutter is attached to a lower surface of the cutter driving unit, the cutter driving unit being configured to move the cutter linearly in a thickness direction of the mother substrate.

4. The cell cutting device of claim 1, wherein the fixing unit is on a stage, the stage being linearly movable along the driving axis.

5. The cell cutting device of claim 1, wherein the fixing unit is on a stage, the stage being rotatably controlled by the rotary driving unit.

6. The cell cutting device of claim 1, further comprising alignment cameras adjacent to the cutter to identify an alignment state of the cutter and the mother substrate.

7. The cell cutting device of claim 6, wherein the alignment cameras are adjacent to opposite sides of the mother substrate.

8. The cell cutting device of claim 6, wherein the mother substrate includes an alignment mark thereon, and the alignment cameras identify the alignment state of the cutter and the mother substrate with the alignment mark.

9. The cell cutting device of claim 6, wherein the alignment cameras include a first camera and a second camera, the second camera being closer to the cutter than the first camera, the first camera firstly identifying the alignment state of the cutter and the mother substrate, and the second camera secondly identifying the alignment state of the mother substrate.

10. The cell cutting device of claim 9, wherein an alignment identifying accuracy of the second camera is higher than an alignment identifying accuracy of the first camera.

11. The cell cutting device of claim 1, further comprising alignment members facing sides of the mother substrate.

12. The cell cutting device of claim 11, wherein the alignment members include a servo motor to compress at least one of the sides of the mother substrate so as to control movement of the mother substrate.

13. The cell cutting device of claim 11, wherein the alignment members face opposite sides of the mother substrate.

14. The cell cutting device of claim 1, wherein the buffer member is supplied roll-to-roll by using a supply roll and a recovery roll.

15. The cell cutting device of claim 14, further comprising a tension-maintaining member between the supply roll and the recovery roll that maintains a tension of the buffer member.

16. The cell cutting device of claim 1, wherein the cutter has a length that is at least equal to or greater than a width of the mother substrate in the cutting direction.

17. The cell cutting device of claim 1, wherein the plurality of cells on the mother substrate correspond to a plurality of flexible display devices.

18. The cell cutting device of claim 1, wherein the plurality of cells on the mother substrate correspond to a plurality of organic light-emitting display devices.

* * * * *